United States Patent [19]
Arami et al.

[11] Patent Number: 5,575,853
[45] Date of Patent: Nov. 19, 1996

[54] VACUUM EXHAUST SYSTEM FOR PROCESSING APPARATUS

[75] Inventors: Junichi Arami, Shinjuku-Ku; Masayuki Kitamura, Fuchu; Mitsuaki Komino, Nakano-Ku, all of Japan

[73] Assignees: Tokyo Electron Limited; Tokyo Electron Tohoku Limited, both of Japan

[21] Appl. No.: 496,480

[22] Filed: Jun. 29, 1995

[30]  Foreign Application Priority Data

Jul. 1, 1994 [JP] Japan .................................. 6-173427
Oct. 24, 1994 [JP] Japan .................................. 6-284391

[51] Int. Cl.⁶ .................................................. C23C 16/00
[52] U.S. Cl. ............................ 118/708; 118/712; 118/715; 118/725
[58] Field of Search ............................ 118/708, 712, 118/715, 725

[56]  References Cited

FOREIGN PATENT DOCUMENTS 60-170234  9/1985  Japan .
5-74716  3/1993  Japan .

Primary Examiner—Richard Bueker
Attorney, Agent, or Firm—Beveridge, DeGrandi, Weilacher & Young, L.L.P.

[57]  ABSTRACT

A main pump having a wide range of vacuum exhaust capabilities and a high exhaust speed is connected adjacent to a processing chamber and an auxiliary pump having a low exhaust speed is connected by a small-diameter auxiliary pipeline to the exhaust side of the main pump. Since a main pump having a wide range of vacuum exhaust capabilities and a high exhaust speed is connected adjacent to the processing chamber in this manner, not only can improvements in the exhaust characteristics be expected, but it is also possible to reduce the diameter of the auxiliary pipeline from the main pump onward and make the auxiliary pump smaller. Since the auxiliary pump having a low exhaust speed is connected by a small-diameter auxiliary pipeline to the exhaust side of the main pump, the size and cost of the entire system can be reduced.

8 Claims, 4 Drawing Sheets

2

VACUUM EXHAUST SYSTEM FOR PROCESSING APPARATUS

BACKGROUND OF THE INVENTION

The present invention relates to a vacuum exhaust system for a processing apparatus.

During the process of fabricating semiconductor devices, various processing apparatuses, such as a low-pressure CVD apparatus, are used for forming films on a semiconductor wafer that is the object to be processed in an environment at a predetermined temperature, with a predetermined processing gas, and at a predetermined pressure. This type of processing apparatus is provided with a processing chamber for accommodating semiconductor wafers and causing a predetermined process to be performed thereon, and it is also provided with a vacuum exhaust system for creating a predetermined low-pressure environment within that processing chamber.

An example of a vacuum exhaust system provided in a prior-art processing apparatus is shown in FIG. 4. This vacuum exhaust system is provided with a mechanical booster pump (MBP) 42 and a pressure control valve 45, connected by a main pipeline 41 to a processing chamber 2 of a processing apparatus 1. A small-diameter roughing pipeline 47 having an auxiliary valve 46 is connected parallel to the main pipeline 41 in such a manner as to link parts thereof that are before and after a main valve 44, and also a vacuum-achieving pipeline 51 having valves 49 and 50 on either side of a turbo molecule pump (TMP) 48 is connected parallel to the main pipeline 41 in such a manner as to link parts thereof that are before the main valve 44 and after the pressure control valve 45. In FIG. 4, reference number 37 denotes a pressure sensor for determining the pressure in the processing chamber 2 and reference number 17 denotes a processing gas supply line having a switching valve 19, which supplies processing gas into the processing chamber 2 and which is connected to a source of processing gas that is not shown in the figure.

With the vacuum exhaust system of the prior-art processing apparatus 1 configured in this manner, first of all a dry pump (DP) 43 is activated in a state in which all of the valves 19, 44, 45, 46, 49, and 50 are closed. The rearward valve 50 of the vacuum-achieving pipeline 51, the auxiliary valve 46 of the roughing pipeline 47, and the pressure control valve 45 are then opened, and roughing at a low exhaust flowrate is performed in such a manner as to ensure that no condensation or dust scattering is caused by sudden changes in pressure within the processing chamber 2. Once the pressure within the processing chamber 2 has reached 10 Torr or so because of this roughing exhaust, the mechanical booster pump 42 is activated, the auxiliary valve 46 is closed, and the main valve 44 is opened, and thus the pressure within the processing chamber 2 is further reduced. Once this has reduced the pressure within the processing chamber 2 to 1 Torr or so, the turbo molecule pump 48 is activated, the main valve 44 is closed, and the forward valve 49 of the vacuum-achieving pipeline 51 is opened, and thus the degree of vacuum within the processing chamber 2 is reduced to the level of $10^{-6}$ Torr or so, causing any adhered particles of water or the like attached to the inner walls of the processing chamber 2 to be removed therefrom. The forward and rearward valves 49 and 50 are then closed, the turbo molecule pump 48 is halted, and the main valve 44 and the switching valve 19 of the processing gas supply pipe 17 are opened, and thus the processing is performed while the pressure within the processing chamber 2 is maintained at a predetermined processing pressure (between 0.1 and 50 Torr) by the pressure control valve 45.

However, the mechanical booster pump 42 used in the processing and as backup for the turbo molecule pump 48 in the above described prior-art vacuum exhaust system is arranged in a utility area that is some distance from the processing chamber 2 provided within the clean room, and thus the main pipeline 41 from the processing chamber 2 to the mechanical booster pump 42 is long (12 to 15 m). This means that the diameter of the main pipeline 41 has to be increased because the conductance of the piping system is so large, and also inevitably a pump with a large exhaust speed (exhaust flow) is necessary, which has the result of increasing the size and cost of the entire system.

SUMMARY OF THE INVENTION

The objective of the present invention is to provide a vacuum exhaust system for a processing apparatus that enables reductions in the size and cost of the entire system.

In order to achieve this objective, the vacuum exhaust system for a processing apparatus in accordance with the present invention is provided with a main pump having a wide range of vacuum exhaust capabilities and a high exhaust speed, which is connected adjacent to the processing chamber, and an auxiliary pump having a low exhaust speed, which is connected by a small-diameter auxiliary pipeline to the exhaust side of the main pump.

The vacuum exhaust system for a processing apparatus in accordance with the present invention is characterized in that the main pump is a molecular drag pump and the auxiliary pump is a dry pump.

The vacuum exhaust system for a processing apparatus in accordance with the present invention is further characterized in being provided with a molecular drag pump connected adjacent to the processing chamber by a short main pipeline having a first valve, a dry pump connected to the exhaust side of the molecular drag pump by an auxiliary pipeline of a diameter smaller than that of the main pipeline, a processing pipeline having a second valve and a pressure control valve and being connected parallel to the main pipeline in such a manner as to link parts of this main pipeline that are before and after the first valve, and a small-diameter roughing pipeline having a third valve and being connected parallel to the main pipeline in such a manner as to link a part of the main pipeline before the first valve to the auxiliary pipeline.

Since a main pump having a wide range of vacuum exhaust capabilities and a high exhaust speed is connected adjacent to the processing chamber in this vacuum exhaust system for a processing apparatus in accordance with the present invention, not only can improvements in the exhaust characteristics be expected, but it is also possible to reduce the diameter of the auxiliary pipeline from the main pump onward and make the auxiliary pump smaller. Since an auxiliary pump having a low exhaust speed is connected by a small-diameter auxiliary pipeline to the exhaust side of the main pump, the size and cost of the entire system can be reduced.

Since a molecular drag pump is used as the main pump and a dry pump is used as the auxiliary pump in the vacuum exhaust system for a processing apparatus in accordance with the present invention, the system can be constructed easily of pumps available on the market. In addition, the capacity of the auxiliary pump and the diameter of the auxiliary pipeline can be made smaller than those of prior-art systems, thus reducing the construction and operating costs.

In addition to enabling reductions in the size and cost of the entire system, the vacuum exhaust system for a processing apparatus in accordance with the present invention provides three types of exhaust: a roughing exhaust through the roughing pipeline to a low degree of vacuum, a processing exhaust through the processing pipeline to a medium degree of vacuum, and a target exhaust through the main pipeline to a high degree of vacuum. Thus it is able to implement a wide range of vacuum exhaust with a simple configuration.

DETAILED DESCRIPTION OF THE PREFERRED EMBODIMENTS

Embodiment 1

Figure 1:
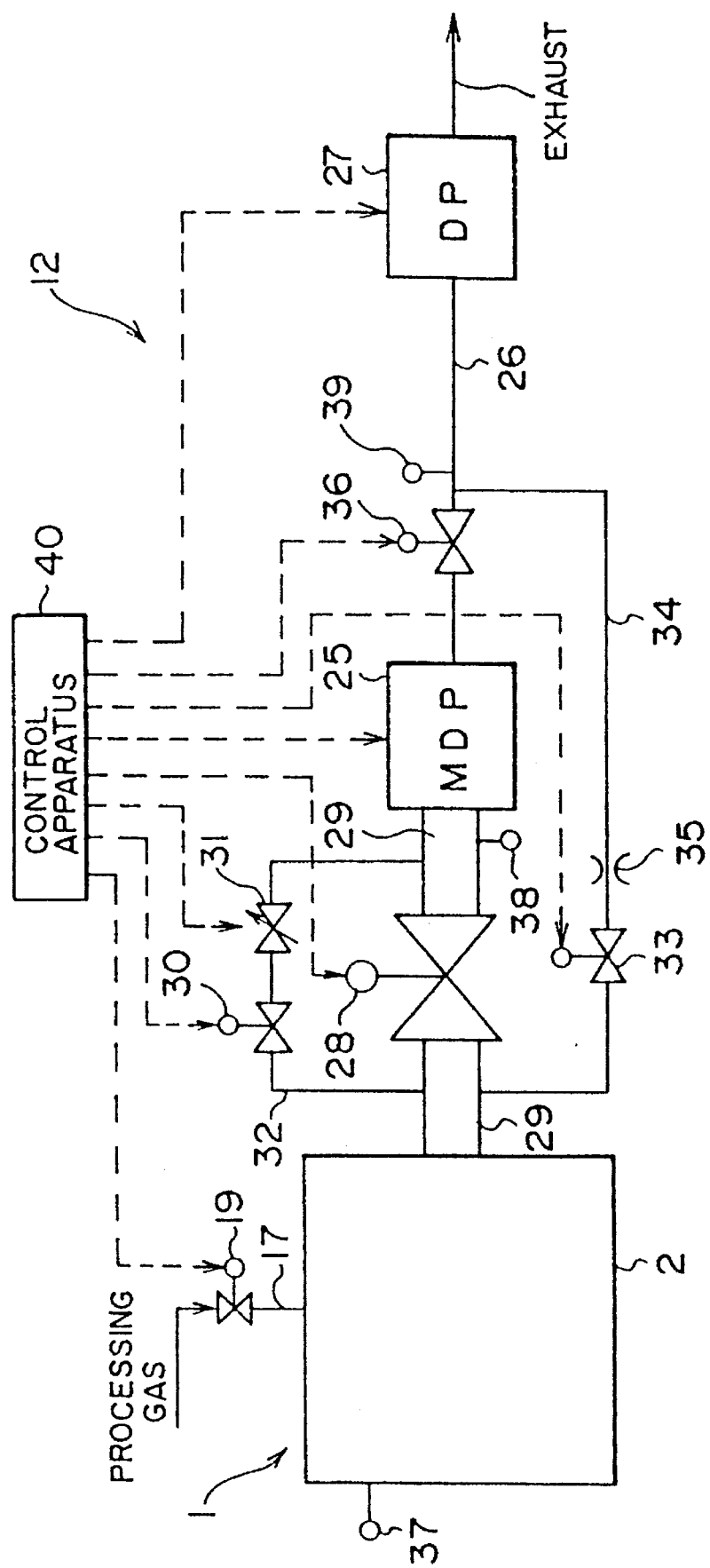
FIG. 1 is a structural diagram of a first embodiment wherein the vacuum exhaust system (having a roughing pipeline) for a processing apparatus in accordance with the present invention is applied to a single-wafer CVD apparatus.
Figure 2:
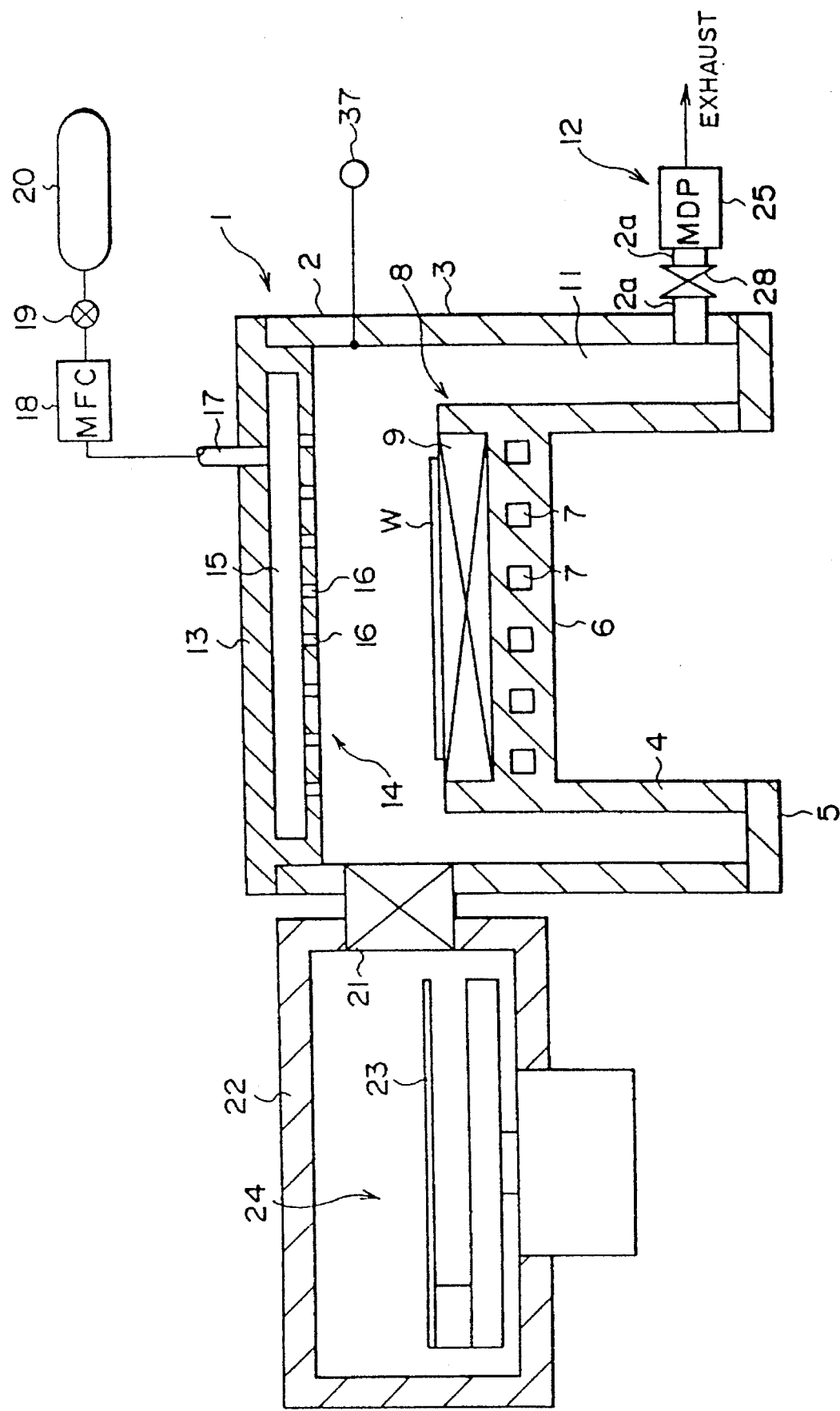
FIG. 2 is a cross-sectional view through the single-wafer CVD apparatus of FIG. 1.

A first embodiment of the present invention will be described below with reference to the accompanying drawings. A single-wafer CVD apparatus is shown in FIG. 1 as an example of a processing apparatus 1. This single-wafer CVD apparatus 1 is provided with a processing chamber 2 in which semiconductor wafers W that are objects to be processed are accommodated one at a time and are subjected to a predetermined processing. This processing chamber 2 is formed of a corrosion-resistant metal such as stainless steel or aluminum and has a substantially cylindrical inner wall 3, as shown in FIG. 2. A substantially cylindrical support member 4 is arranged on the inner side of this inner wall 3 and an annular peripheral baseplate portion 5 is provided between a lower end portion of this support member 4 and a lower end portion of the inner wall 3. A central baseplate portion 6 is provided on an upper side of the support member 4 and cooling passageways 7 for the circulation of a coolant medium such as water are formed within this central baseplate portion 6, for cooling the same.

An upper portion of the central baseplate portion 6 is formed as a mounting stand 8 for holding a semiconductor wafer W horizontally, and a heater portion 9 for heating this semiconductor wafer W is provided in this mounting stand 8. The heater portion 9 is formed of a resistance heating member such as tantalum wire arranged in a flat shape and is configured in such a manner that it can heat the surface of a semiconductor wafer uniformly to a predetermined processing temperature of, for example, 700° C. to 1000° C. Note that the mounting stand 8 is provided with an elevator mechanism (not shown) for raising the semiconductor wafer W above the mounting stand 8 while the semiconductor wafer W is being transferred by a conveyor apparatus 24 which will be described later. An open portion 11 is formed between the inner wall 3 of the processing chamber 2 and the support member 4, and a vacuum exhaust system 12 for evacuating the interior of the processing chamber 2 to a predetermined low-pressure environment of, for example, 100 to $10^{-6}$ Torr through the annular open portion 11 is connected to the inner wall 3 of the processing chamber 2.

A lid member 13 is provided at an upper edge portion of the processing chamber 2 to hermetically seal an upper opening edge of the inner wall 3. A processing gas supply portion 14 is provided in the lid member 13 facing the heater portion 9 in order to supply a processing gas such as silane ($SiH_4$) into the processing chamber 2. The lid member 13 has a so-called showerhead structure which is formed in such a manner as to have a central portion 15 in the interior thereof, and also a plurality of processing gas blowholes 16 are formed therein to link the lower surface thereof with the central portion 15. This configuration ensures that the processing gas is supplied as a shower that maintains a uniform distribution into the processing chamber 2 from the processing gas blowholes 16 of the processing gas supply portion 14. A processing gas supply pipe 17 communicating with the central portion 15 is connected to the lid member 13, and this processing gas supply pipe 17 is connected to a processing gas supply source 20 with a mass flow controller (MFC) 18 and a switching valve 19 therebetween.

A load-lock chamber 22 that is configured to be sealed by a gate valve 21 provided in the inner wall 3 of the processing chamber 2 is arranged outside the processing chamber 2. This load-lock chamber 22 is configured to be controlled to a predetermined low-pressure environment by the vacuum exhaust system, in the same manner as the processing chamber 2. A conveyor apparatus 24 having a conveyor arm 23 that transfers a semiconductor wafer W from a cassette within an adjoining cassette accommodation chamber (not shown), through a gate valve (not shown), to the mounting stand 8 in the processing chamber 2, and vice versa, is provided in the load-lock chamber 22.

As means for reducing pressure, the vacuum exhaust system 12 is provided with a main pump that is a molecular drag pump (MDP) 25 having a wide range of vacuum exhaust capabilities and a high exhaust speed, which is connected adjacent to the processing chamber 2, and an auxiliary pump that is a dry pump (DP) 27 having a low exhaust speed, which is connected by a small-diameter auxiliary pipeline 26 to an exhaust side of the molecular drag pump, as shown in FIG. 1. The molecular drag pump 25 is configured in such a manner that a special rotor with a surface on which a screw groove (helical groove) is cut is made to rotate within a housing to evacuate the system (an example of this pump is made by the company Alcatel). This type of pump differs from a turbo molecule pump which expels molecules by rotary vanes in that there is little attachment and accumulation of component substances of the processing gas, it is possible to attach the pump directly to the processing chamber 2 without requiring an exhaust trap, and also the pump has a wide range of vacuum exhaust capabilities (of, for example, approximately 100 to $10^{-5}$ Torr) and a high exhaust speed (of, for example, approximately 6000 liters/minute).

By connecting the molecular drag pump 25 adjacent to the processing chamber 2, stable exhaust characteristics are obtained and it is also possible to design the auxiliary pipeline 26 downstream from the molecular drag pump 25 to have a small diameter and the dry pump 27, which is the auxiliary pump, to have a small capacity. The molecular drag pump 25 is connected adjacent to the processing chamber 2 by a short main pipeline 29 having a first valve 28 and of a predetermined aperture, such as approximately 100 mm. The dry pump 27, which has a low exhaust flowrate of, for example, approximately 700 liters/minute, is connected to the exhaust side of the molecular drag pump 25 by the auxiliary pipeline 26 which has a small diameter of, for example, approximately 40 mm.

The dry pump 27 has a structure that evacuates by the rotation of a pair of mutually engaging rotors within a housing and differs from an ordinary oil pump in that there is no reverse-flow of lubricating oil that could act as a source of contamination of the semiconductor wafers, and hence is suitable as an auxiliary pump for the processing apparatus.

Since this dry pump 27 is located in a utility box that is some distance from the processing chamber 2 within the clean room, a long auxiliary pipeline 26 of approximately 10 to 12 m is used. In addition to having the function of acting as a back-pump ensuring the critical backing pressure (approximately 30 Torr) of the molecular drag pump 25, which is the main pump providing the target exhaust or the processing exhaust, the dry pump 27 itself also functions as a pump for performing roughing exhaust. The exhaust side of the dry pump 27 is connected to the factory exhaust system (not shown) by an exhaust gas processing apparatus. In particular, in comparison with the critical backing pressure (1 Torr) of a prior-art turbo molecule pump, the critical backing pressure provided by the molecular drag pump 25 can be ensured up to 30 Torr. There is no example in the prior art in which this molecular drag pump (MDP) 25 is using in film formation.

In a similar manner, a processing pipeline 32 of a predetermined diameter, such as approximately 25 mm, and having a second valve 30 and a pressure control valve 31 is connected parallel to the main pipeline 29 in such a manner as to link parts of the main pipeline 29 before and after the first valve 28. A roughing pipeline 34 of a small diameter, such as approximately 10 mm, and having a third valve 33 is connected parallel to the main pipeline 29 in such a manner as to link a part of the main pipeline 29 before the first valve 28 to the auxiliary pipeline 26. The roughing pipeline 34 is provided with an orifice 35 for further controlling the exhaust speed during the roughing exhaust performed by the dry pump 27. Thus the vacuum exhaust system in accordance with the present invention is configured to be capable of providing three types of vacuum evacuation: a roughing exhaust that evacuates the interior of the processing chamber 2 through the roughing pipeline 34 to a low degree of vacuum, such as approximately 20 Torr; a processing exhaust that evacuates the interior of the processing chamber 2 through the processing pipeline 32 to a medium degree of vacuum, such as approximately 1 to 50 Torr; and a target exhaust that evacuates the interior of the processing chamber 2 through the main pipeline 29 to a high degree of vacuum that is the target vacuum, such as approximately $10^{-6}$ Torr.

Note that a fourth valve 36 is provided in the auxiliary pipeline 26 upstream of the portion at which the roughing pipeline 34 is connected. The first to fourth valves 28, 30, 33, and 36 are configured of switching valves. A first pressure sensor 37 is provided in the processing chamber 2, a second pressure sensor 38 is provided downstream of the first valve 28 of the main pipeline 29, and a third pressure sensor 39 is provided downstream of the fourth valve 36 of the auxiliary pipeline 26. The configuration is such that components such as the switching valve 19 of the processing gas supply pipe 17, the first to fourth valves 28, 30, 33, and 36, the molecular drag pump 25, and the dry pump 27 are controlled in accordance with detection values fed back from the first to third pressure sensors 28, 30, and 33 and predetermined programming that is previously input to a control apparatus 40.

The operation of the vacuum exhaust system of this first embodiment of the present invention will now be described. First of all, at the start of the processing, the dry pump 27 is activated in a state in which all of the valves 19, 28, 30, 31, 33, and 36, including the gate valve 21, are closed. The fourth valve 36 of the auxiliary pipeline 26 is opened when the third pressure sensor 39 of the auxiliary pipeline 26 detects a set pressure, and then the third valve 33 of the roughing pipeline 34 is opened when the second pressure sensor 38 of the main pipeline 29 detects a set pressure. This causes roughing exhaust of the interior of the processing chamber 2 by the dry pump 27 through the roughing pipeline 34. This roughing exhaust is performed until the pressure within the processing chamber 2 reaches a predetermined level, such as 20 Torr.

When the first pressure sensor 37 of the processing chamber 2 detects that the pressure within the processing chamber 2 has reached 20 Torr, the molecular drag pump 25 is activated, the first valve 28 of the main pipeline 29 is opened, and also the third valve 33 of the roughing pipeline 34 is closed, to cause main exhaust (target exhaust) of the interior of the processing chamber 2 through the main pipeline 29. This main exhaust (target exhaust) is performed until the pressure within the processing chamber 2 reaches the target pressure, such as $10^{-6}$ Torr. The target exhaust process (initialization) ends at the point at which the first pressure sensor 37 of the processing chamber 2 detects $10^{-6}$ Torr.

Once this target exhaust process has ended, the semiconductor wafer W which is the object to be processed, and which has already been introduced from a cassette within the wafer cassette accommodation chamber into the load-lock chamber 22 shown in FIG. 2 by the conveyor arm 23 of the conveyor apparatus 24, is conveyed onto the mounting stand 8 within the processing chamber 2 through the gate valve 21 that opens at the point at which the pressure within the load-lock chamber 22 has been reduced to the same level as the pressure within the processing chamber 2. The gate valve 21 is then closed and the processing sequence starts. In this case, both the second valve 30 and pressure control valve 31 of the processing pipeline 32 are opened, the first valve 28 of the main pipeline 29 is closed, and the switching valve 19 of the processing gas supply pipe 17 is opened to start the processing.

The predetermined processing is performed for the predetermined time in a state in which the pressure within the processing chamber 2 is maintained at the predetermined level by the pressure control valve 31. Once the processing has ended, the switching valve 19 of the processing gas supply pipe 17 and the second valve 30 and pressure control valve 31 of the processing pipeline 32 are closed, the first valve 28 of the main pipeline 29 is opened, and target exhaust of the interior of the processing chamber 2 is performed. After it is processed, the semiconductor wafer W is conveyed from the processing chamber 2 through the load-lock chamber 22 and into the cassette in the cassette accommodation chamber. The next semiconductor wafer W is then moved from that cassette through the load-lock chamber 22 and onto the mounting stand 8 in the processing chamber 2, and thus semiconductor wafers are sequentially processed one at a time by the procedure described above.

In accordance with this vacuum exhaust system 12 for the single-wafer CVD apparatus configured in this manner, since the molecular drag pump 25 acting as the main pump and having a wide range of vacuum exhaust capabilities and a high exhaust speed is connected adjacent to the processing chamber 2, not only can improvements in the exhaust characteristics be expected, but it is also possible to reduce the diameter of the auxiliary pipeline 26 from the molecular drag pump 25 onward and make the dry pump 27, which is the auxiliary pump, smaller. In addition, since the dry pump 27 having a low exhaust speed is connected by the small-diameter auxiliary pipeline 26 to the exhaust side of this molecular drag pump (MDP) 25, the entire system can be made smaller and less expensive.

Since this first embodiment uses a molecular drag pump (MDP) 25 and a dry pump (DP) 27, pumps that are freely available on the market can be used, and thus the system can be easily constructed. The capacity of the auxiliary pump and the diameter of the auxiliary pipeline 26 can be designed to be smaller than those of prior-art systems, thus reducing the construction and operating costs. This vacuum exhaust system 12 of this first embodiment, provides three types of exhaust: a roughing exhaust through the roughing pipeline 34 to a low degree of vacuum, a processing exhaust through the processing pipeline 32 to a medium degree of vacuum, and a target exhaust through the main pipeline 29 to a high degree of vacuum. Thus it is able to implement a wide range of vacuum exhaust with a simple configuration.

Embodiment 2

Figure 3:
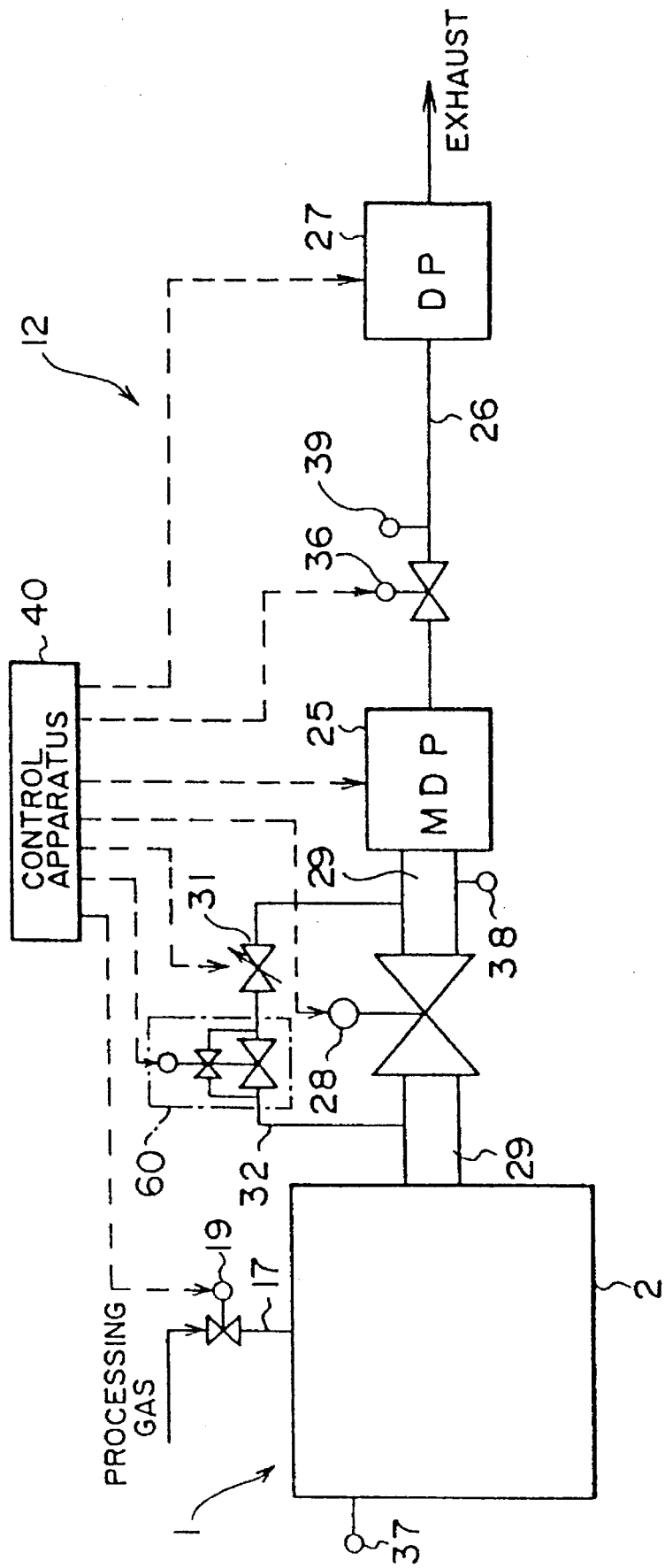
FIG. 3 is a structural diagram of a second embodiment of the vacuum exhaust system (having no roughing pipeline) for a processing apparatus in accordance with the present invention.
Figure 4:
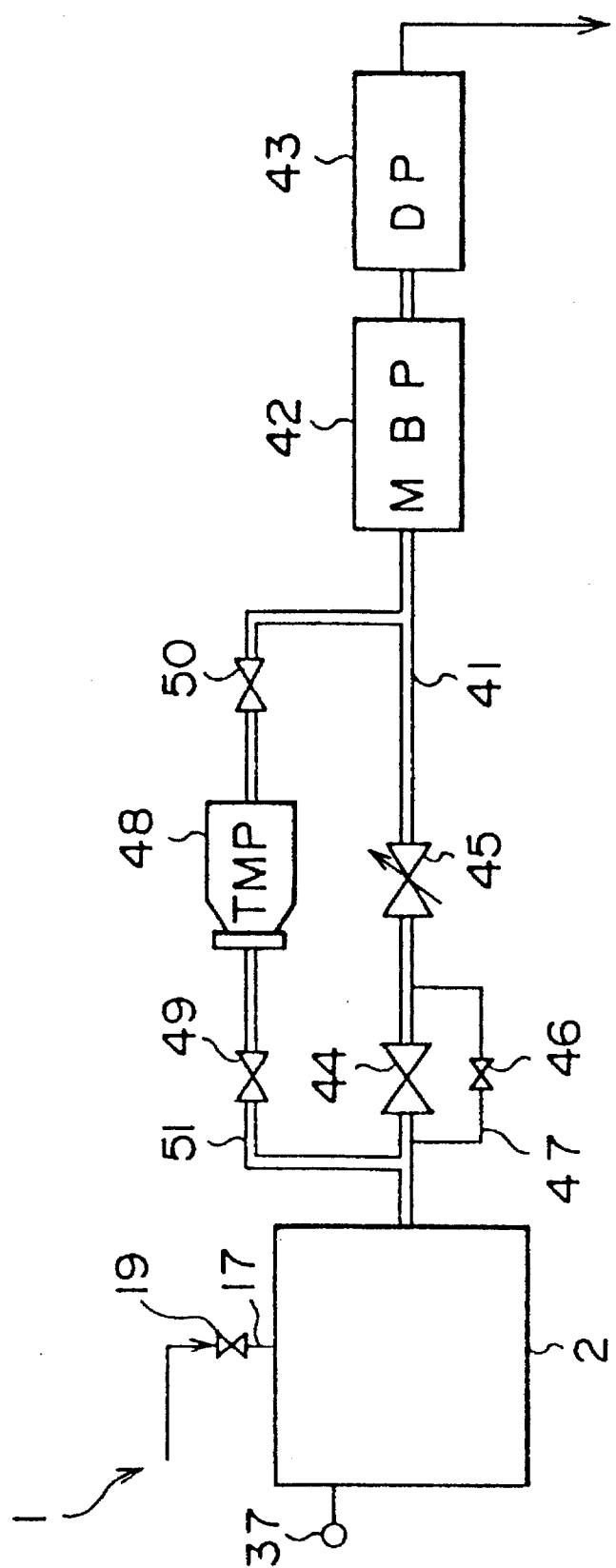
FIG. 4 is a structural diagram of an example of a vacuum exhaust system of the prior art.

A structural diagram of a second embodiment of the vacuum exhaust system in accordance with the present invention is shown in FIG. 3. A vacuum exhaust system 12 of this second embodiment is mainly configured of a molecular drag pump (MDP) 25 connected adjacent to a processing chamber 2 by a short main pipeline 29 having a first valve 28, a dry pump (DP) 27 connected to an exhaust side of the molecular drag pump 25 by an auxiliary pipeline 26 of a diameter smaller than that of the main pipeline 29, and a processing pipeline 32 having a compound valve 60 (which incorporates a roughing valve that functions as a second valve) and a pressure control valve 31 which is connected parallel to the main pipeline 29 in such a manner as to link parts of the main pipeline 29 before and after the first valve 28. The other components are the same as those described in the first embodiment, so they are given the same reference numbers and further description thereto is omitted.

The vacuum exhaust system 12 of this second embodiment differs from that of the above described first embodiment in that it is not provided with a roughing pipeline 34, but instead the compound valve 60 is provided in the processing pipeline 32 to enable use of the processing pipeline 32 for roughing exhaust.

With the vacuum exhaust system 12 of this second embodiment, first of all the dry pump 27 is activated in a state in which all of the valves 28, 36, and 60, including the gate valve 21 (see FIG. 2), are closed. Roughing exhaust of the interior of the processing chamber 2 is performed through the processing pipeline 32 by opening the fourth valve 36 and the roughing valve of the compound valve 60. Once this roughing exhaust ends, the molecular drag pump 25 is activated, and target exhaust of the interior of the processing chamber 2 is performed through the main pipeline 29 by closing the roughing valve of the compound valve 60 and opening the first valve 28. When this target exhaust process ends, the first valve 28 of the main pipeline 29 is closed and also the compound valve 60 of the processing pipeline 32 is opened, and processing is performed while the pressure within the processing chamber 2 is controlled at the predetermined level by the pressure control valve 31 of the processing pipeline 32.

Thus, since the vacuum exhaust system 12 of this second embodiment enables roughing exhaust through the processing pipeline 32 by the provision of the compound valve 60 in the processing pipeline 32, there is no need for the roughing pipeline 34 (see FIG. 1) and the removal of this unnecessary component enables further reductions in the size and cost of the entire system. The vacuum exhaust system 12 of this second embodiment also removes the absolute necessity for the fourth valve 36 and the third pressure sensor 39.

It should be noted that the present invention is not limited to the embodiments described herein; various other implementations thereof can be conceived within the scope of the accompanying claims. For example, the heater portion 9 (see FIG. 2) of the above described embodiments need not heat the surface of the semiconductor wafer W to a uniform temperature by having the resistance heating members arranged in concentric circles or a similar form; the configuration could be such that any desired temperature control could enabled by means such as causing a suitable temperature distribution in concentric circles over the surface of the semiconductor wafer W. In addition, the processing apparatus to which the present invention is applied could be any other apparatus, such as a batch type of CVD apparatus, an oxidation apparatus, a diffusion apparatus, an etching apparatus, or an ashing apparatus, instead of a single-wafer CVD apparatus. Similarly, the object to be processed could be an LCD substrate, instead of a semiconductor wafer W.

The following advantageous effects are provided by the vacuum exhaust system in accordance with the present invention:

1. Since the vacuum exhaust system for a processing apparatus in accordance with the present invention provides a main pump that is connected adjacent to the processing chamber and has a wide range of vacuum exhaust capabilities and a high exhaust speed, improved exhaust characteristics can be expected and it is also possible to reduce the diameter of the auxiliary pipeline downstream of the main pump and the size of the auxiliary pump. Connecting the auxiliary pump, which has a low exhaust speed, by the small-diameter auxiliary pipeline to the exhaust side of the main pump enables reductions in the size and cost of the entire system.

2. Since a molecular drag pump is used as the main pump and a dry pump is used as the auxiliary pump in the vacuum exhaust system for a processing apparatus in accordance with the present invention, the system can be constructed easily of pumps available on the market. This means that the capacity of the auxiliary pump and the diameter of the auxiliary pipeline can be made smaller than those of prior-art systems, thus reducing the construction and operating costs.

3. In addition to enabling reductions in the size and cost of the entire system, the vacuum exhaust system for a processing apparatus in accordance with the present invention provides three types of exhaust: a roughing exhaust through the roughing pipeline to a low degree of vacuum, a processing exhaust through the processing pipeline to a medium degree of vacuum, and a target exhaust through the main pipeline to a high degree of vacuum. Thus it is able to implement a wide range of vacuum exhaust with a simple configuration.

What is claimed is:

1. A vacuum exhaust system for a processing apparatus comprising:

a molecular drag pump connected adjacent to a processing chamber by a short main pipeline having a first valve;

a dry pump connected to an exhaust side of said molecular drag pump by an auxiliary pipeline having a fourth valve and being of a diameter smaller than that of said main pipeline;

a processing pipeline having a second valve and a pressure control valve, and being connected parallel to said main pipeline in such a manner as to link parts of said main pipeline that are upstream and downstream of said first valve; and a roughing pipeline of a diameter smaller than that of said main pipeline, having a third valve, and being connected parallel to said main pipeline in such a manner as to link a part of said main pipeline upstream of said first valve to said auxiliary pipeline.

2. The vacuum exhaust system according to claim 1, wherein a first pressure sensor is provided in said processing chamber, a second pressure sensor is provided downstream of said first valve of said main pipeline, and a third sensor is provided downstream of said fourth valve of said auxiliary pipeline.

3. The vacuum exhaust system according to claim 2, wherein a control apparatus is provided and detection values of said first, second, and third pressure sensors are fed back in such a manner that said first, second, third, and fourth valves together with said molecular drag pump and said dry pump are controlled thereby in accordance with programming that is previously input to said control apparatus.

4. The vacuum exhaust system according to claim 1, wherein a control apparatus is provided, a pressure sensor is provided in said processing chamber, and a detection value of said pressure sensor is fed back in such a manner that a switching valve in a processing gas supply line to said processing chamber is controlled thereby in accordance with programming that is previously input to said control apparatus.

5. The vacuum exhaust system according to claim 1, wherein a heater portion for an object to be processed is provided in said processing chamber, said heater portion is formed of a resistance heating member arranged in a concentric circular manner, and also temperature control is enabled in such a manner that a suitable temperature distribution of a concentric circular shape is created in a surface of said semiconductor wafer.

6. A vacuum exhaust system for a processing apparatus comprising:

a molecular drag pump connected adjacent to a processing chamber by a short main pipeline having a first valve;

a dry pump connected to an exhaust side of said molecular drag pump by an auxiliary pipeline having a fourth valve and being of a diameter smaller than that of said main pipeline; and a processing pipeline having a second valve and a pressure control valve, and being connected parallel to said main pipeline in such a manner as to link parts of said main pipeline that are upstream and downstream of said first valve.

7. The vacuum exhaust system according to claim 6, wherein a first pressure sensor is provided in said processing chamber, a second pressure sensor is provided downstream of said first valve of said main pipeline, and a third sensor is provided downstream of said fourth valve of said auxiliary pipeline.

8. The vacuum exhaust system according to claim 7, wherein a control apparatus is provided and detection values of said first, second, and third pressure sensors are fed back in such a manner that said first, second, third, and fourth valves together with said molecular drag pump and said dry pump are controlled thereby in accordance with programming that is previously input to said control apparatus.

* * * * *